US012641708B2

(12) United States Patent
Akashi

(10) Patent No.: US 12,641,708 B2
(45) Date of Patent: May 26, 2026

(54) ELECTRONIC APPARATUS

(71) Applicant: FUJIFILM Corporation, Tokyo (JP)

(72) Inventor: Yota Akashi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 122 days.

(21) Appl. No.: 18/470,432

(22) Filed: Sep. 20, 2023

(65) Prior Publication Data

US 2024/0130035 A1 Apr. 18, 2024

(30) Foreign Application Priority Data

Oct. 14, 2022 (JP) ................................. 2022-165499

(51) Int. Cl.
| | |
|---|---|
| *H05K 1/02* | (2006.01) |
| *H05K 1/18* | (2026.01) |
| *H05K 1/181* | (2026.01) |
| *H05K 3/00* | (2006.01) |
| *H05K 5/00* | (2025.01) |

(52) U.S. Cl.
CPC ........... *H05K 1/0215* (2013.01); *H05K 1/181* (2013.01); *H05K 3/0058* (2013.01); *H05K 5/006* (2013.01); *H05K 2201/10015* (2013.01); *H05K 2201/10265* (2013.01); *H05K 2203/06* (2013.01)

(58) Field of Classification Search
CPC .... H05K 1/0215; H05K 1/181; H05K 3/0058; H05K 5/006; H05K 2201/10015; H05K 2201/10265; H05K 2203/06; H05K 9/0026
See application file for complete search history.

(56) References Cited

U.S. PATENT DOCUMENTS

| | | | | | |
|---|---|---|---|---|---|
| 4,827,327 | A | * | 5/1989 | Miyauchi | .......... H01L 23/49822 257/E23.189 |
| 5,832,598 | A | * | 11/1998 | Greenman | .............. H01L 24/97 257/E23.114 |
| 6,057,600 | A | * | 5/2000 | Kitazawa | ................ H01L 23/66 257/691 |
| 6,075,211 | A | * | 6/2000 | Tohya | .................... H05K 1/165 361/795 |

(Continued)

FOREIGN PATENT DOCUMENTS

| | | |
|---|---|---|
| JP | H05335771 | 12/1993 |
| JP | 2002076538 | 3/2002 |

(Continued)

OTHER PUBLICATIONS

"Notice of Reasons for Refusal of Japan Counterpart Application", issued on Mar. 24, 2026, with English translation thereof, p. 1-p. 10.

*Primary Examiner* — Benyam Ketema
(74) *Attorney, Agent, or Firm* — JCIPRNET

(57) ABSTRACT

An electronic apparatus includes: an electronic component; a substrate including a first layer at which the electronic component and a first ground pattern are disposed, and a second layer at which a second ground pattern is disposed; and a case which is in contact with the first ground pattern, covers the electronic component, reduces magnetic noise, and is fixed to the substrate, and plural conductors connecting the first ground pattern and the second ground pattern are disposed along a portion of the first ground pattern, the portion being in contact with the case.

16 Claims, 16 Drawing Sheets

(56)                References Cited

U.S. PATENT DOCUMENTS

| | | | | |
|---|---|---|---|---|
| 6,130,483 | A * | 10/2000 | Shizuki | H01L 23/66 |
| | | | | 257/684 |
| 6,154,176 | A * | 11/2000 | Fathy | H01Q 9/0414 |
| | | | | 343/846 |
| 6,344,609 | B1 * | 2/2002 | Nakano | H01L 23/49805 |
| | | | | 361/753 |
| 6,472,598 | B1 * | 10/2002 | Glenn | H01L 23/24 |
| | | | | 257/E23.114 |
| 6,714,422 | B2 * | 3/2004 | Okubora | H05K 1/16 |
| | | | | 361/795 |
| 6,734,542 | B2 * | 5/2004 | Nakatani | H05K 1/188 |
| | | | | 257/687 |
| 7,478,474 | B2 * | 1/2009 | Koga | H01L 23/3121 |
| | | | | 29/841 |
| 7,659,604 | B2 * | 2/2010 | Fujiwara | H05K 9/0022 |
| | | | | 257/659 |
| 8,362,370 | B2 * | 1/2013 | Satou | H05K 9/0026 |
| | | | | 361/816 |
| 8,816,906 | B2 * | 8/2014 | Kamgaing | H01L 25/16 |
| | | | | 342/368 |
| 9,055,682 | B2 * | 6/2015 | Mugiya | H01L 23/552 |
| 10,312,172 | B2 * | 6/2019 | Otsubo | H01L 23/552 |
| 11,602,042 | B2 * | 3/2023 | Odagiri | H05K 1/0224 |
| 12,256,526 | B2 * | 3/2025 | Gao | H05K 9/0032 |
| 2002/0008595 | A1 * | 1/2002 | Ohta | H01P 1/36 |
| | | | | 333/1.1 |
| 2002/0011907 | A1 * | 1/2002 | Yamada | H01L 23/5385 |
| | | | | 333/204 |
| 2002/0080593 | A1 * | 6/2002 | Tsuge | H05K 9/0026 |
| | | | | 361/818 |
| 2002/0168798 | A1 * | 11/2002 | Glenn | H01L 23/552 |
| | | | | 438/110 |
| 2003/0090883 | A1 * | 5/2003 | Asahi | H01L 25/16 |
| | | | | 257/E21.705 |
| 2004/0018658 | A1 * | 1/2004 | Mano | H01L 21/4857 |
| | | | | 257/E23.114 |
| 2004/0160752 | A1 * | 8/2004 | Yamashita | H05K 1/187 |
| | | | | 257/E23.178 |

| | | | | |
|---|---|---|---|---|
| 2004/0232452 | A1 * | 11/2004 | Tsuneoka | H01L 23/60 |
| | | | | 257/E23.125 |
| 2005/0017740 | A1 * | 1/2005 | Higashitani | H05K 1/186 |
| | | | | 361/728 |
| 2005/0088260 | A1 * | 4/2005 | Ajioka | H01Q 1/2283 |
| | | | | 257/E23.114 |
| 2005/0162841 | A1 * | 7/2005 | Ogatsu | H05K 9/0039 |
| | | | | 361/816 |
| 2005/0206468 | A1 * | 9/2005 | Kimata | H05K 9/0039 |
| | | | | 333/12 |
| 2006/0197718 | A1 * | 9/2006 | Yamate | H05K 1/148 |
| | | | | 361/679.21 |
| 2006/0220737 | A1 * | 10/2006 | Sanderson | H03H 11/1213 |
| | | | | 336/200 |
| 2012/0000699 | A1 * | 1/2012 | Inoue | H01L 23/29 |
| | | | | 174/257 |
| 2013/0078915 | A1 * | 3/2013 | Zhao | H01L 23/36 |
| | | | | 257/532 |
| 2014/0016293 | A1 * | 1/2014 | Song | H05K 9/0218 |
| | | | | 29/829 |
| 2014/0368968 | A1 * | 12/2014 | Lee | H01G 4/30 |
| | | | | 361/301.4 |
| 2015/0016066 | A1 * | 1/2015 | Shimamura | H05K 1/0216 |
| | | | | 29/841 |
| 2015/0062835 | A1 * | 3/2015 | Kai | H01L 23/552 |
| | | | | 361/748 |
| 2015/0119102 | A1 * | 4/2015 | Saji | H01L 23/5384 |
| | | | | 455/550.1 |
| 2015/0155084 | A1 * | 6/2015 | Kim | H01F 17/0013 |
| | | | | 336/200 |
| 2017/0311448 | A1 * | 10/2017 | Kawabata | H01L 23/552 |
| 2019/0191597 | A1 * | 6/2019 | Han | H01Q 21/0087 |
| 2019/0223287 | A1 * | 7/2019 | Nishida | H05K 5/0069 |
| 2019/0307028 | A1 * | 10/2019 | Yazaki | H01Q 1/24 |
| 2019/0364663 | A1 * | 11/2019 | Yosui | H05K 1/115 |

FOREIGN PATENT DOCUMENTS

| | | |
|---|---|---|
| JP | 2004179594 | 6/2004 |
| JP | 2010080854 | 4/2010 |
| JP | 2016178221 | 10/2016 |
| JP | 2021064670 | 4/2021 |

* cited by examiner

first region

INPUT/OUTPUT CAPACITOR

151c

111

POWER SUPPLY IC

151d

INPUT/OUTPUT CAPACITOR

113a

171a

151a

171b

113b

151b

POWER SUPPLY COIL

112

161

141 second region

110

180

ELECTRONIC APPARATUS

CROSS-REFERENCE TO RELATED APPLICATIONS

The present application claims priority under 35 U.S.C. § 119 to Japanese Patent Application No. 2022-165499 filed on Oct. 14, 2022. The above application is hereby expressly incorporated by reference, in its entirety, into the present application.

BACKGROUND OF THE INVENTION

1. Field of the Invention

The present invention relates to an electronic apparatus.

2. Description of the Related Art

JP1993-335771A (JP-H05-335771A) discloses an electromagnetic wave shielding structure including a multilayer printed wiring board in which a metal layer for shielding is provided as an inner layer, and a high-frequency component is mounted on an upper surface layer; and a shield case composed of a front cover and a frame, covering the high-frequency component from an upper surface side, and connected to the metal layer by soldering in a state in which a leg provided to protrude from a lower side of the frame is inserted into a through hole formed in the multilayer printed wiring board, in which the high-frequency component is electromagnetically shielded by the shield case and the metal layer.

JP2021-064670A discloses an electronic apparatus including a printed substrate having a multilayer structure in which a ground pattern is formed between layers; a land for grounding is formed on a surface thereof, and the land is conductive to the ground pattern through a via, an electronic component mounted in a region surrounded by the land on the printed substrate; and a lid composed of a metal material, covering the electronic component from above, and soldered after aligning a lower end portion of a side surface portion so as to overlap the land for mounting, in which radiation noise from the electronic component is suppressed by the lid and the ground pattern.

JP2004-179594A discloses a mounting structure of a shield member, in which the shield member is composed of a metal housing frame for accommodating an electronic component and a cover for closing an opening portion of the housing frame, a suction member that is sucked by a suction nozzle for automatic mounting is provided in the opening portion of the housing frame, and the suction member is breakable such that the suction member can be removed during maintenance.

JP2010-080854A discloses an electronic apparatus including a mountable shield case composed of a shield frame attached to a main board and a shield cover attached to the shield frame, in which the shield frame includes a side wall portion surrounding a first electronic component group, and an extension portion and a suction pad that extend from a top portion of the side wall portion to an inner peripheral side of the side wall portion, and the suction pad is sucked by a suction-type robot hand in a case of mounting the shield frame on the main board, and the like.

SUMMARY OF THE INVENTION

One embodiment according to the technology of the present disclosure provides an electronic apparatus capable of improving an effect of reducing magnetic noise generated from an electronic component disposed on a substrate.

(1)

An electronic apparatus comprising an electronic component; a substrate including a first layer at which the electronic component and a first ground pattern are disposed, and a second layer at which a second ground pattern is disposed; and a case which is in contact with the first ground pattern, covers the electronic component, reduces magnetic noise, and is fixed to the substrate, in which a plurality of conductors connecting the first ground pattern and the second ground pattern are arranged along a portion of the first ground pattern, which is in contact with the case.

(2)

The electronic apparatus according to (1), in which the electronic component includes at least one of a power supply circuit, a coil, or a capacitor.

(3)

The electronic apparatus according to (1) or (2), in which an area of the second ground pattern as viewed in a lamination direction of the substrate is larger than an area of a region of the substrate at which the electronic component is disposed.

(4)

The electronic apparatus according to (3), in which the second ground pattern is formed in a region including the region at which the electronic component is disposed as viewed in the lamination direction of the substrate.

(5)

The electronic apparatus according to any one of (1) to (4), in which the case includes a frame portion fixed to the substrate and a cover portion attached to the frame portion, and the frame portion has a suction target portion capable of being sucked so that the frame portion is lifted.

(6)

The electronic apparatus according to any one of (1) to (5), in which the first ground pattern is disposed to surround the electronic component as viewed in a lamination direction of the substrate.

(7)

The electronic apparatus according to (6), in which the plurality of conductors are arranged to surround the electronic component as viewed in a lamination direction of the substrate.

(8)

The electronic apparatus according to any one of (1) to (7), in which an arrangement density of the plurality of conductors varies depending on a position in a region sandwiched between the first ground pattern and the second ground pattern.

(9)

The electronic apparatus according to (8), in which a distribution of the arrangement density of the plurality of conductors is a distribution according to a position of the electronic component on the substrate.

(10)

The electronic apparatus according to (8) or (9), in which the region sandwiched between the first ground pattern and the second ground pattern includes a first region and a second region that is closer to an end portion of the substrate than the first region, and the arrangement density of the plurality of conductors is higher in the second region than in the first region.

(11)

The electronic apparatus according to any one of (8) to (10), in which a distribution of the arrangement density of the plurality of conductors is a distribution according to a positional relationship between the electronic component and an electronic element disposed outside the case.

(12)

The electronic apparatus according to (11), in which the region sandwiched between the first ground pattern and the second ground pattern includes a third region and a fourth region, a path in which the magnetic noise reaches the electronic element from the electronic component through the fourth region is shorter than a path in which the magnetic noise reaches the electronic element from the electronic component through the third region, and the arrangement density of the plurality of conductors is higher in the fourth region than in the third region.

(13)

The electronic apparatus according to any one of (1) to (12), in which the plurality of conductors are a plurality of vias connecting layers of the substrate.

(14)

The electronic apparatus according to (13), in which the vias are vias whose holes are filled with conductors that reduce the magnetic noise.

(15)

The electronic apparatus according to (13) to (14), in which the plurality of vias are a plurality of connected vias.

(16)

The electronic apparatus according to any one of (1) to (15), in which the plurality of conductors are arranged at a pitch of not more than twice a width of the conductor.

(17)

The electronic apparatus according to any one of (1) to (16), in which the substrate is a substrate having three or more layers including the first layer and the second layer.

According to the present invention, it is possible to provide an electronic apparatus capable of improving an effect of reducing magnetic noise generated from an electronic component disposed on a substrate.

BRIEF DESCRIPTION OF THE DRAWINGS

FIG. 1 is a cross-sectional view showing an electronic apparatus 100 according to the present embodiment.

DESCRIPTION OF THE PREFERRED
EMBODIMENTS

Hereinafter, an example of an embodiment of the present invention will be described with reference to the drawings.

Electronic Apparatus of Embodiment

Figure 1:
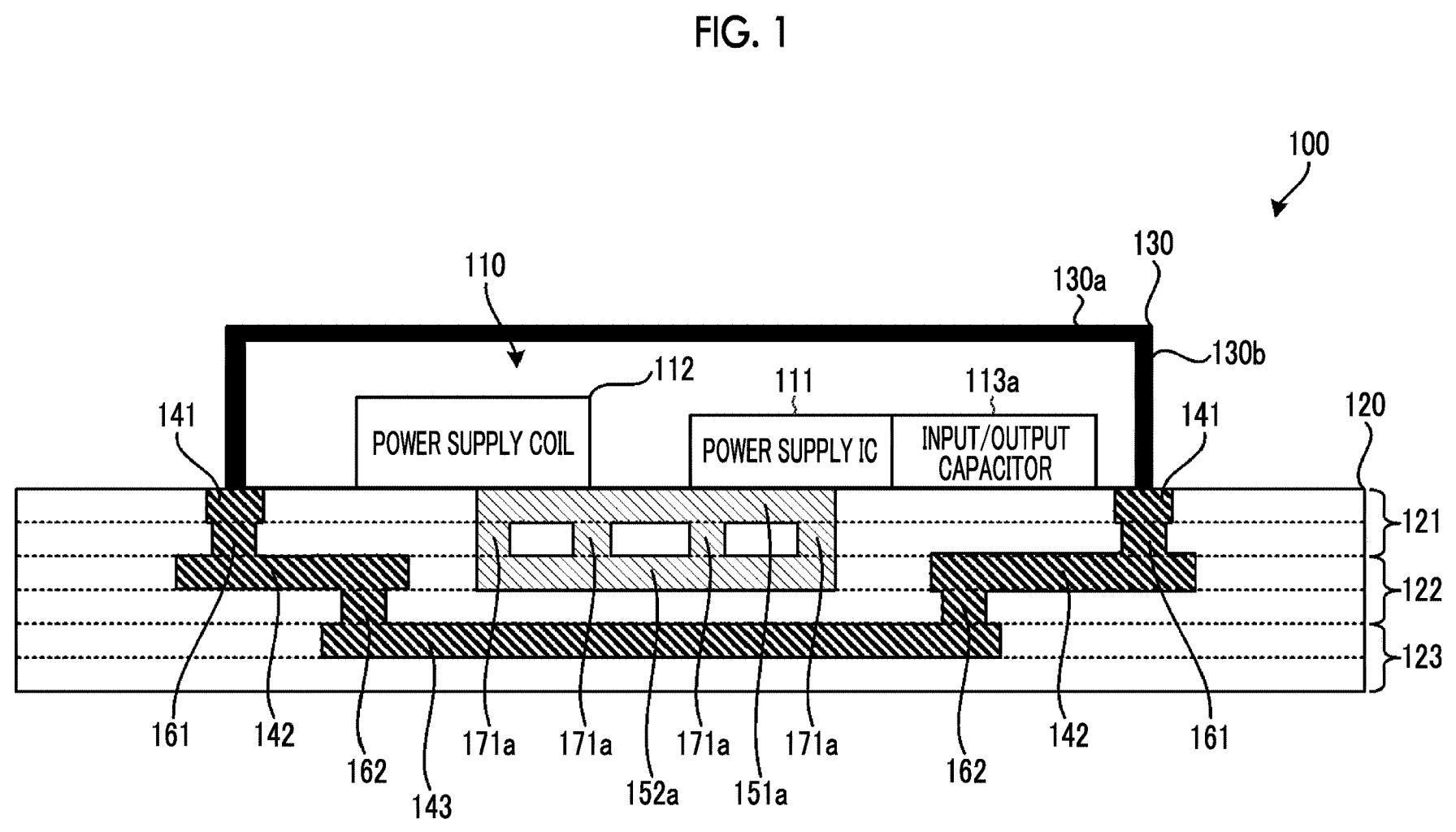

FIG. 1 is a cross-sectional view showing an example of an electronic apparatus of the present embodiment. FIG. 1 shows a cross-sectional view of a periphery of a power supply unit in an electronic apparatus 100. As shown in FIG. 1, the electronic apparatus 100 includes a substrate 120 composed of a plurality of layers (three layers in this example), an electronic component (power supply circuit 110) disposed on the substrate 120, and a shield case 130 disposed to cover the electronic component. The electronic apparatus 100 is an electronic apparatus including an electronic element which is susceptible to an influence of magnetic noise generated by the electronic component, for example, a camera including an imaging element, a projector including a modulation element, and the like.

Figure 2:
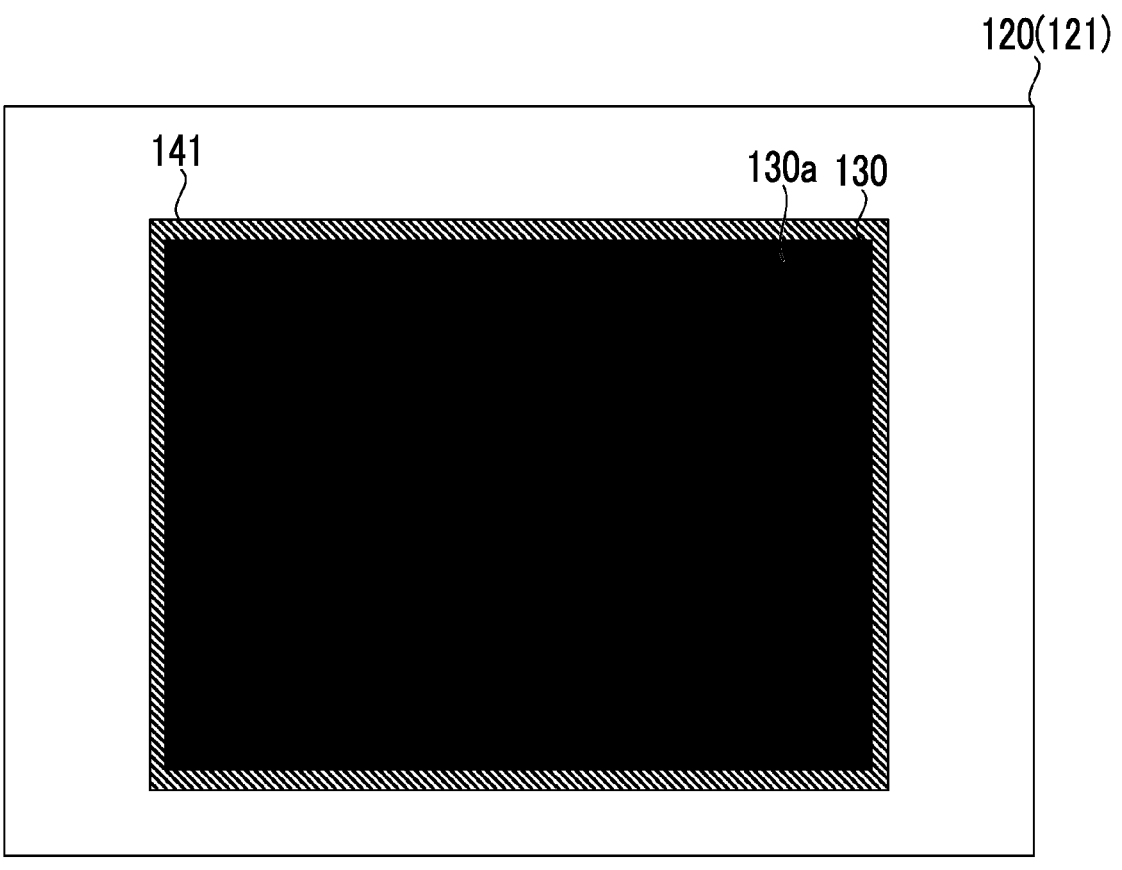
FIG. 2 is a top view of the electronic apparatus 100 shown in FIG. 1.
Figure 3:
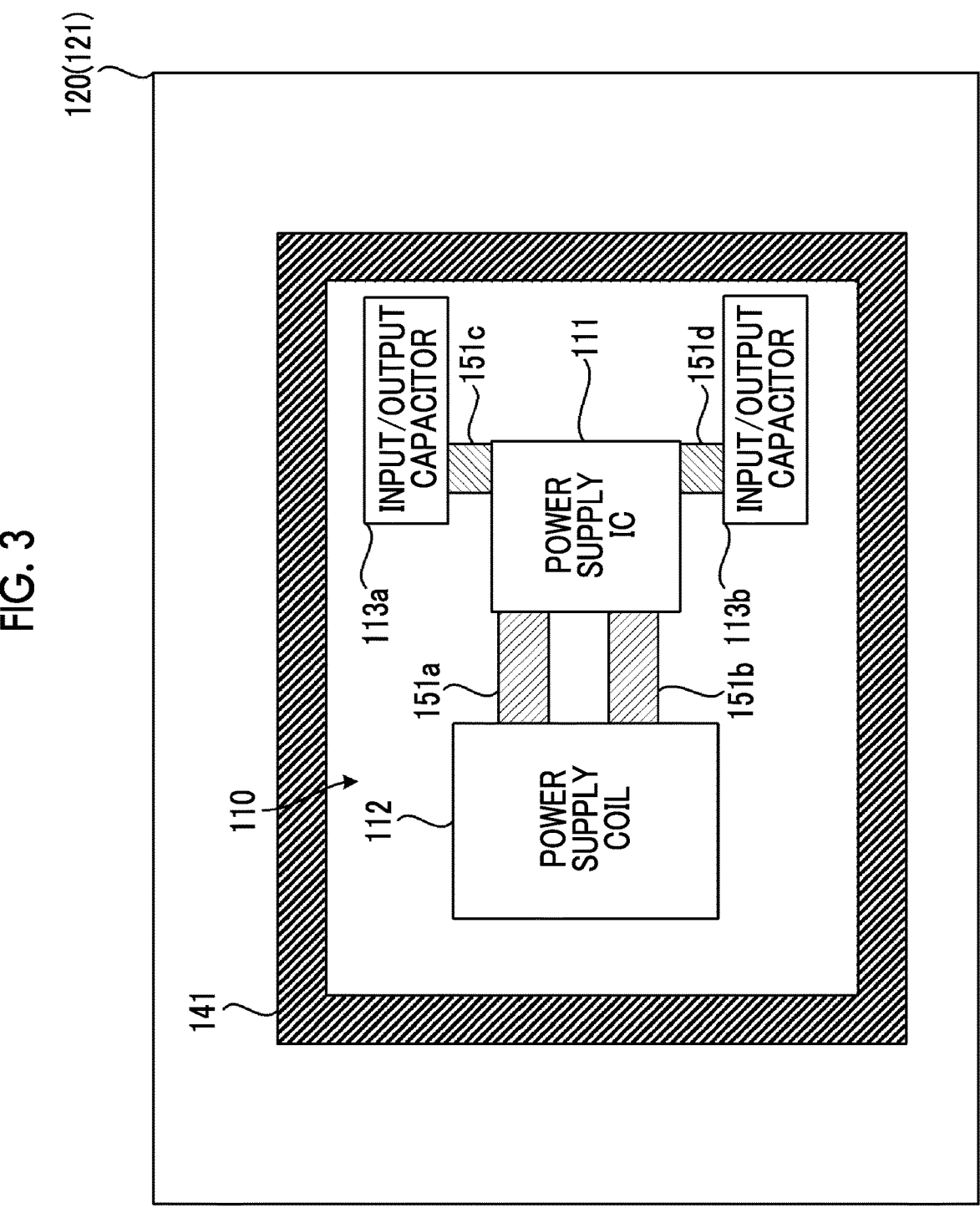
FIG. 3 is a diagram showing a surface layer portion of a first layer 121 of a substrate 120 from which a shield case 130 in FIG. 2 has been removed.
Figure 4:
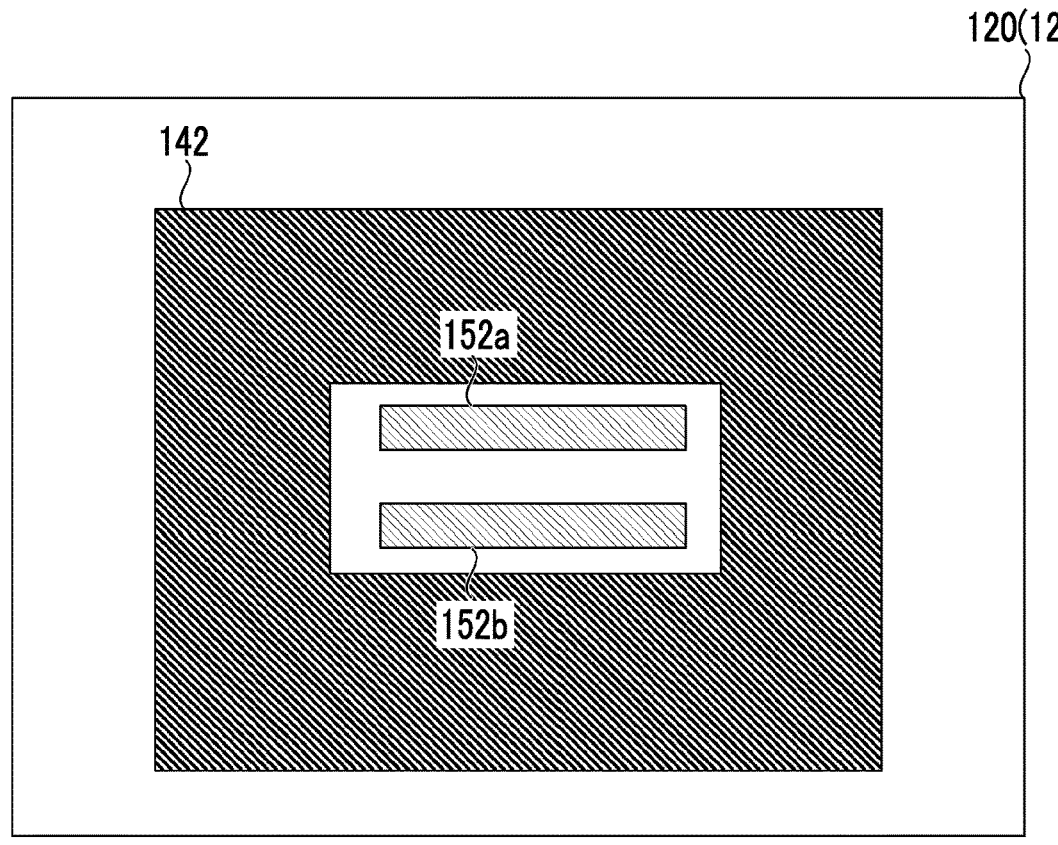
FIG. 4 is a diagram showing a surface layer portion of a second layer 122 of the substrate 120.
Figure 5:
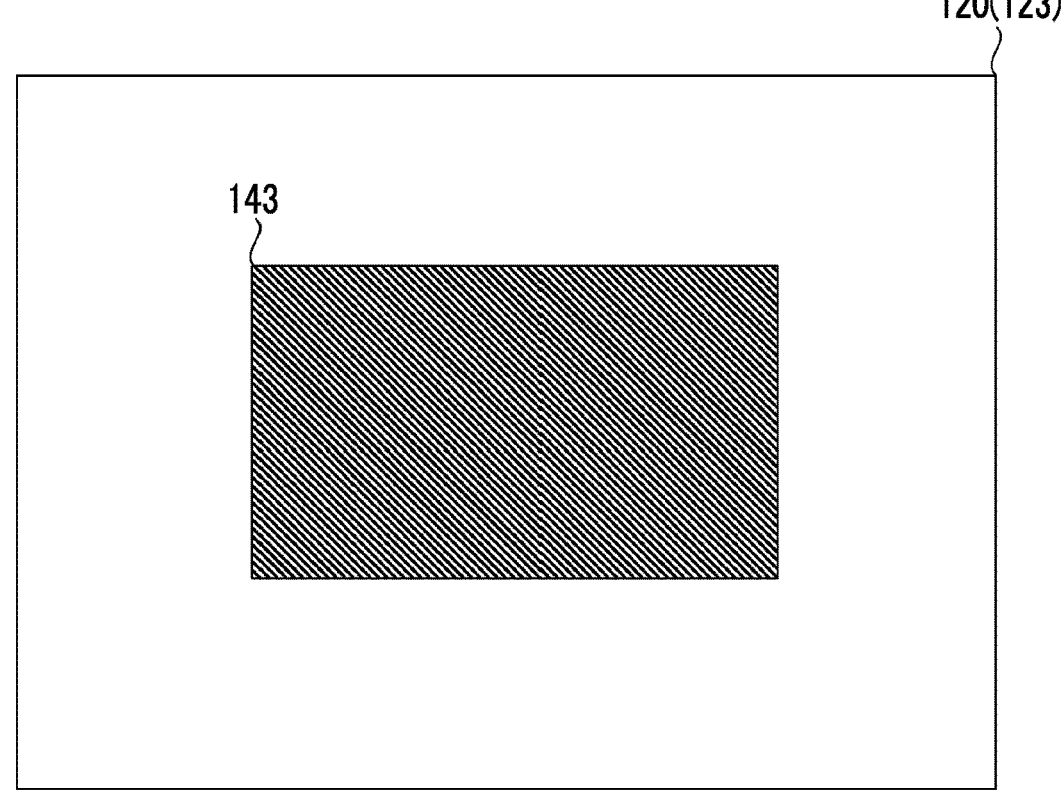
FIG. 5 is a diagram showing a surface layer portion of a third layer 123 of the substrate 120.

FIG. 2 is a top view of the electronic apparatus 100 shown in FIG. 1. FIG. 3 is a diagram showing a surface layer portion of a first layer 121 of the substrate 120 from which the shield case 130 in FIG. 2 has been removed. FIG. 4 is a diagram showing a surface layer portion of a second layer 122 of the substrate 120. FIG. 5 is a diagram showing a surface layer portion of a third layer 123 of the substrate 120. The first layer 121 is formed on the frontmost side (top side in FIG. 1) of the substrate 120. The second layer 122 is formed on a lower side of the first layer 121, and the third layer 123 is formed on a lower side of the second layer 122.

As shown in FIGS. 1 and 3, the power supply circuit 110 is provided on the surface layer portion of the first layer 121. The power supply circuit 110 of this example includes a power supply integrated circuit (IC) 111, a power supply coil 112, and input/output capacitors 113a and 113b. The power supply IC 111 and the power supply coil 112 are connected by power supply line patterns 151a and 151b formed on the surface layer portion of the first layer 121. Similarly, the power supply IC 111 and the input/output capacitor 113a are connected by a power supply line pattern 151c, and the power supply IC 111 and the input/output capacitor 113b are connected by a power supply line pattern 151d.

In addition, as shown in FIGS. 1 and 3, a ground pattern 141 is formed on the surface layer portion of the first layer 121. The ground pattern 141 is formed to surround the power supply circuit 110 as viewed from a lamination direction of the substrate 120. Surrounding the power supply circuit 110 includes a form in which the ground pattern 141 surrounds the power supply circuit 110 without gaps (continuously without interruption) and a form in which the ground pattern 141 surrounds the power supply circuit 110 with gaps (interrupted portions). The ground pattern 141 of this example shows a form in which the ground pattern 141 surrounds the power supply circuit 110 without gaps. The ground pattern 141 of this example is formed as a rectangular frame pattern that surrounds the power supply circuit 110. The ground pattern 141 is an example of a first ground pattern of the present invention.

As shown in FIGS. 1 and 4, power supply line patterns 152a and 152b and a ground pattern 142 are formed on the surface layer portion of the second layer 122. The power supply line pattern 152a is formed at a position corresponding to the power supply line pattern 151a formed on the surface layer portion of the first layer 121. The power supply line pattern 152b is formed at a position corresponding to the power supply line pattern 151b formed on the surface layer portion of the first layer 121.

The ground pattern 142 is formed to surround the power supply line patterns 152a and 152b as viewed from the lamination direction of the substrate 120. The ground pattern 142 of this example is formed as a rectangular frame pattern that surrounds the power supply line patterns 152a and 152b. A frame pattern width of the ground pattern 142 is formed to be wider than a frame pattern width of the ground pattern 141 formed on the surface layer portion of the first layer 121. An inner region of the frame pattern of the ground pattern 142 is formed at a position overlapping a part of the region of the power supply circuit 110 disposed on the surface layer portion of the first layer 121 as viewed from the lamination direction of the substrate 120.

In addition, the region of the ground pattern 142 has a larger area than the region of the power supply circuit 110 disposed on the surface layer portion of the first layer 121 as viewed from the lamination direction of the substrate 120. The region of the ground pattern 142 is provided such that a region at which the power supply circuit 110 of the first layer 121 is disposed is included in the region of the ground pattern 142 as viewed from the lamination direction of the substrate 120. The ground pattern 142 is an example of a second ground pattern of the present invention.

As shown in FIGS. 1 and 5, a ground pattern 143 is formed on the surface layer portion of the third layer 123. The ground pattern 143 is formed in a rectangular shape as viewed from the lamination direction of the substrates 120. The region of the ground pattern 143 has a larger area than the regions of the power supply line patterns 152a and 152b formed on the surface layer portion of the second layer 122 as viewed from the lamination direction of the substrate 120. The region of the ground pattern 143 is provided so as to include the regions of the power supply line patterns 152a and 152b of the second layer 122 in the region of the ground pattern 143 as viewed from the lamination direction of the substrate 120. In addition, the rectangular ground pattern 143 is formed at a position where a region of at least a part of an entire peripheral portion thereof overlaps the ground pattern 142 of the second layer 122 as viewed from the lamination direction of the substrate 120.

As shown in FIGS. 1 and 2, the shield case 130 is provided on the surface layer portion of the first layer 121. The shield case 130 is formed in a recessed shape having a space portion that can accommodate the power supply circuit 110. The shield case 130 has a rectangular top wall 130a that is disposed so as to cover an upper side of the power supply circuit 110, and a side wall 130b that extends from each side of the top wall 130a toward the surface layer portion of the first layer 121. The shield case 130 is made of a metal material having high conductivity, for example, copper, aluminum, a copper-based alloy, or the like. A thickness of the shield case 130 is, for example, 0.2 mm to 0.3 mm. The shield case 130 is formed such that an area of the rectangular top wall 130a is slightly smaller than an area of a region in which the ground pattern 141 is formed, as viewed from the lamination direction of the substrates 120. The shield case 130 is disposed such that a lower end portion of the side wall 130b overlaps the ground pattern 141 and is fixed to the substrate 120 by being soldered to the ground pattern 141.

As shown in FIG. 1, the ground pattern 141 of the first layer 121 and the ground pattern 142 of the second layer 122 are electrically connected by vias 161 formed of a conductor. Similarly, the ground pattern 142 of the second layer 122 and the ground pattern 143 of the third layer 123 are electrically connected by vias 162. In addition, the power supply line pattern 151a of the first layer 121 and the power supply line pattern 152a of the second layer 122 are electrically connected by vias 171a. The vias will be described in detail with reference to FIG. 6 and subsequent figures.

Vias Arranged on Substrate 120

Figure 6:
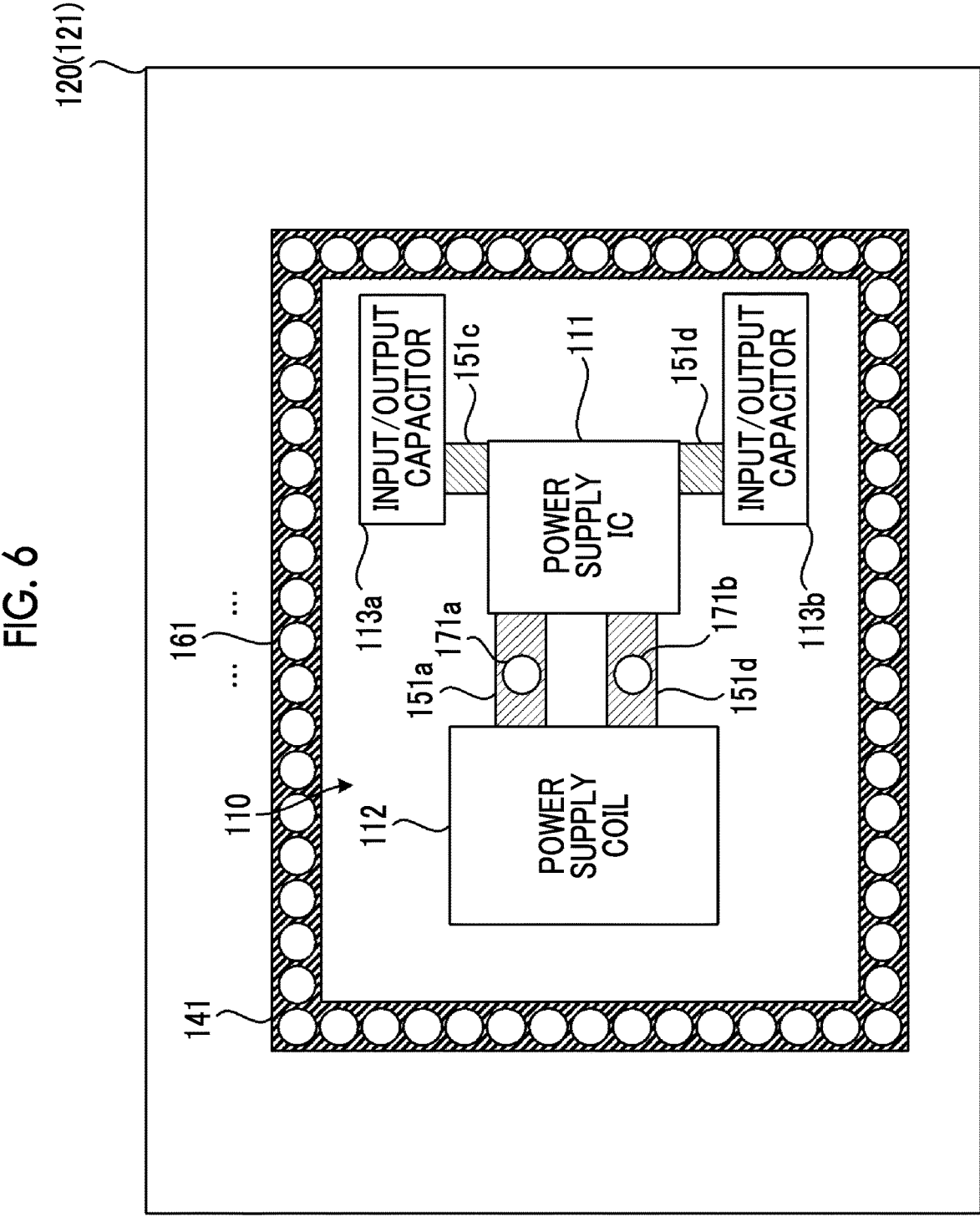
FIG. 6 is a diagram showing vias 161, 171a, and 171b formed in the first layer 121.

FIG. 6 is a diagram showing an example of the vias 161 and vias 171a and 171b formed on the first layer 121 of the substrate 120. The vias 161 are vias that electrically connect the ground pattern 141 of the first layer 121 which is a surface layer and the ground pattern 142 of the second layer 122 which is one of inner layers. As shown in FIG. 6, the vias 161 are arranged in the ground pattern 141 so as to surround the power supply circuit 110 as viewed from the lamination direction of the substrate 120. The vias 161 are disposed at positions corresponding to the lower end portion of the side wall 130b of the shield case 130 that overlaps the ground pattern 141. That is, the vias 161 are arranged along a portion of the ground pattern 141 that is in contact with the side wall 130b of the shield case 130.

The vias 171a are vias that electrically connect the power supply line pattern 151a of the first layer 121 which is the surface layer and the power supply line pattern 152a of the second layer 122 which is one of the inner layers. Similarly, the vias 171b are vias that electrically connect the power supply line pattern 151b of the first layer 121 and the power supply line pattern 152b of the second layer 122. The vias 161 and the vias 171a and 171b are, for example, vias formed in a tubular shape, and inner surfaces thereof are plated with copper. The vias 161 and the vias 171a and 171b of this example are formed in a cylindrical shape.

Figure 7:
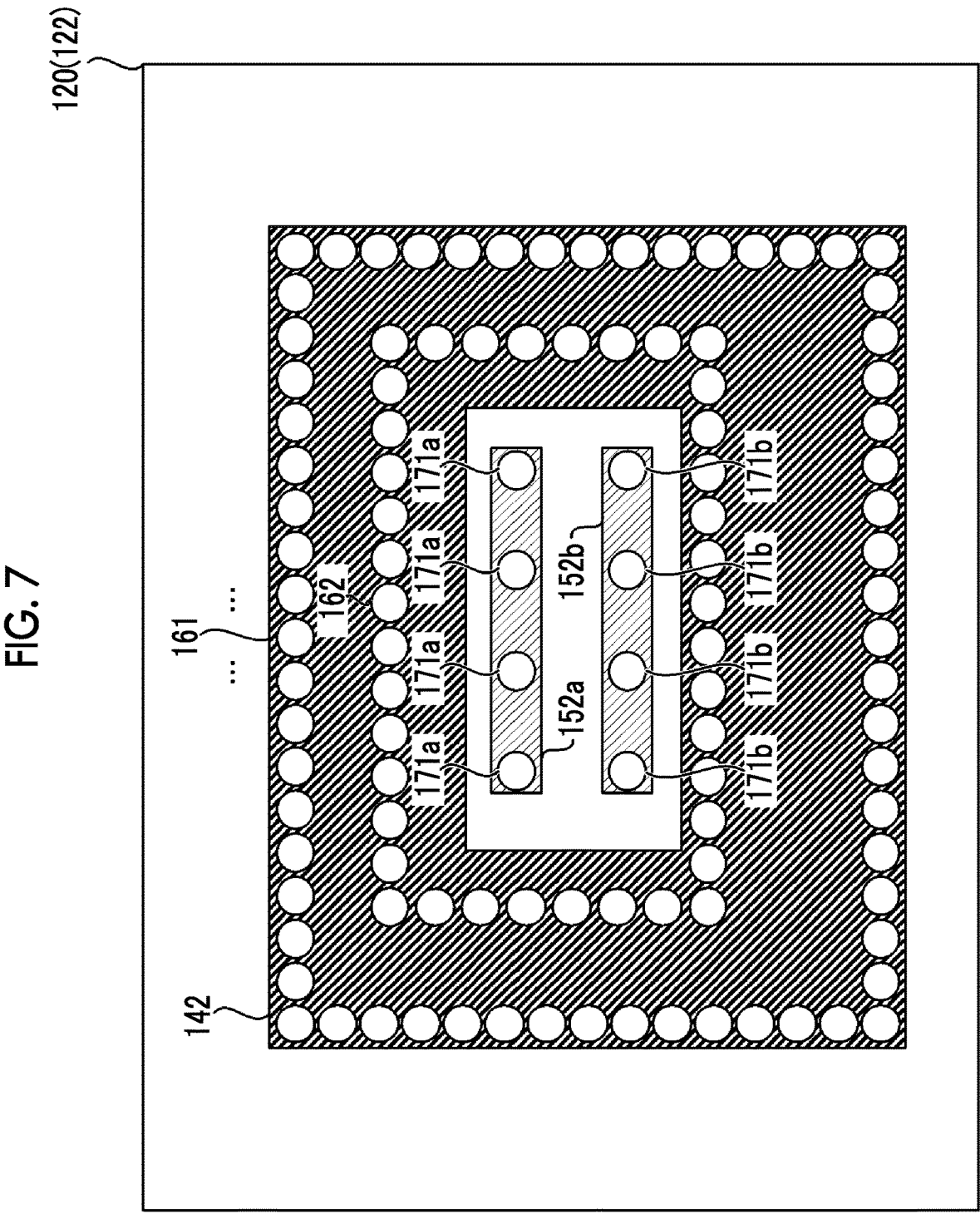
FIG. 7 is a diagram showing vias 161, 162, 171a, and 171b formed in the second layer 122.

FIG. 7 is a diagram showing an example of the vias 161, the vias 162, and the vias 171a and 171b formed on the second layer 122 of the substrate 120. As described with reference to FIG. 6, the vias 161 are vias that electrically connect the ground pattern 141 of the first layer 121 and the ground pattern 142 of the second layer 122. The vias 162 are vias that electrically connect the ground pattern 142 of the second layer 122 which is one of the inner layers, and the ground pattern 143 of the third layer 123 which is one of the inner layers. As shown in FIG. 7, the vias 162 are arranged in the ground pattern 142 so as to surround the power supply line patterns 152a and 152b of the second layer 122 as viewed from the lamination direction of the substrate 120.

As described with reference to FIG. 6, the vias 171a and 171b are vias that electrically connect the power supply line patterns 151a and 151b of the first layer 121 and the power supply line patterns 152a and 152b of the second layer 122. The vias 171a are arranged along the power supply line pattern 152a. The vias 171b are arranged along the power supply line pattern 152b. In addition, although the vias 171a and 171b are seen one by one in the power supply line patterns 151a and 151b shown in FIG. 6, a plurality of the vias 171$a$ and 171$b$ are also arranged to correspond to the vias 171$a$ and 171$b$ of the power supply line patterns 152$a$ and 152$b$ shown in FIG. 7. The configuration of the vias 162 are the same as that of the vias 161.

Figure 8:
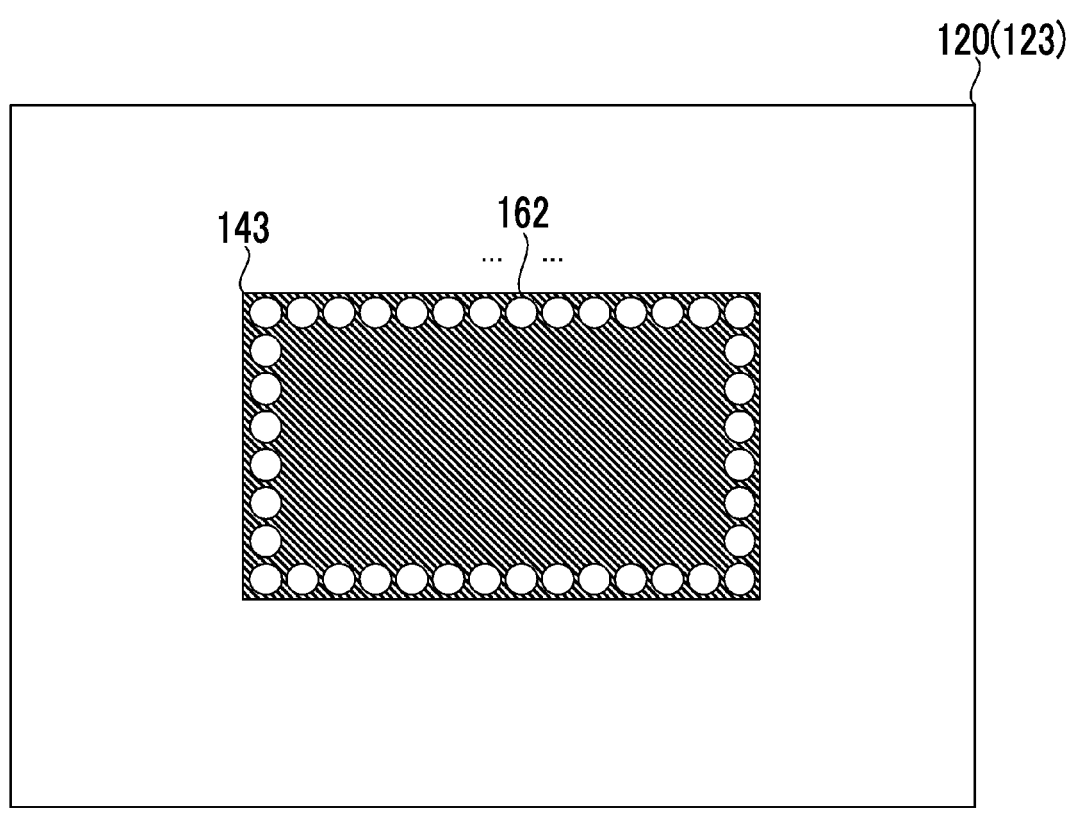
FIG. 8 is a diagram showing the vias 162 formed in the third layer 123.

FIG. 8 is a diagram showing an example of the vias 162 formed on the third layer 123 of the substrate 120. As described with reference to FIG. 7, the vias 162 are vias that electrically connect the ground pattern 142 of the second layer 122 and the ground pattern 143 of the third layer 123. The vias 162 are arranged along an outer portion of the rectangular ground pattern 143 as viewed from the lamination direction of the substrate 120.

Width and Interval of Vias

Figure 9:
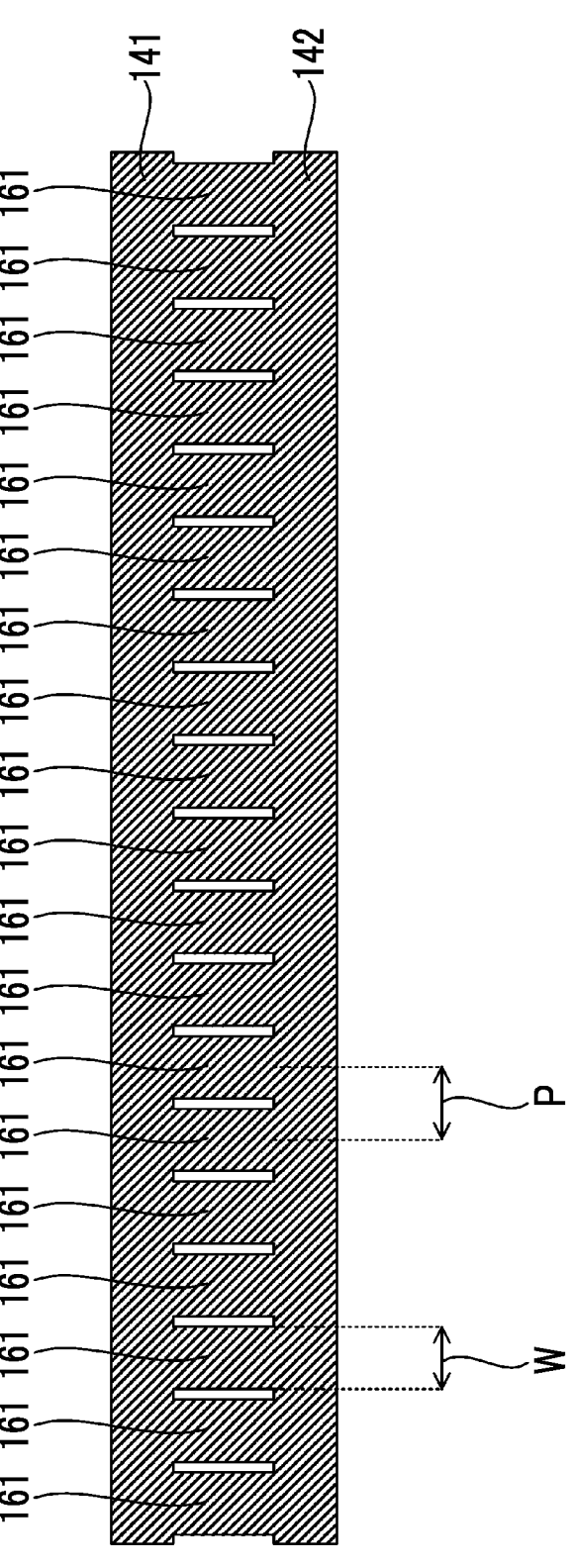
FIG. 9 is a diagram showing a width and a pitch of vias 161 that electrically connect a ground pattern 141 of the first layer 121 and a ground pattern 142 of the second layer 122.

Next, a width (size) and an interval of the vias formed on the substrate 120 will be described. FIG. 9 is a diagram showing vias 161 that electrically connect the ground pattern 141 of the first layer 121 and the ground pattern 142 of the second layer 122. As shown in FIG. 9, assuming that a width of the vias 161 is a width W and a pitch (interval) of the vias 161 is a pitch P, the pitch P of the vias 161 is formed to be not more than twice the width W (P≤2W).

In a case where the via 161 is formed in a cylindrical shape, the width W of the via 161 is a diameter of the via 161. Therefore, in a case where the substrate 120 is viewed from a side as shown in FIG. 9, an occupied area ratio of the vias 161 is 50% or more, and an occupied area ratio of regions in which the vias 161 are not arranged (regions between adjacent vias 161) is less than 50%.

In a case where the pitch P and the width W of the vias 161 are equal (P=W), adjacent vias 161 are in contact with each other, and an occupancy ratio of the vias 161 in a case where the substrate 120 is viewed from the side is 100%. Although the vias 161 have been described with reference to FIG. 9, the vias 162 that electrically connect the ground pattern 142 of the second layer 122 and the ground pattern 143 of the third layer 123 are also formed to have the same width W and pitch P as the vias 161.

As described above, in the electronic apparatus 100 of the present embodiment, the vias 161 that connect the ground pattern 141 of the first layer 121 and the ground pattern 142 of the second layer 122 are arranged between the first layer 121 and the second layer 122, and the vias 162 that connect the ground pattern 142 of the second layer 122 and the ground pattern 143 of the third layer 123 are arranged between the second layer 122 and the third layer 123.

Accordingly, the vias 161 and 162 can cover a periphery of the power supply circuit 110 together with the shield case 130 fixed to the first layer 121 and can improve an effect of blocking magnetic noise generated from the power supply circuit 110. By using the vias 161 and 162 connecting the ground patterns 141, 142, and 143 of the layers of the multilayer substrate as a shield on the side of the substrate 120 in this manner, the effect of blocking magnetic noise can be improved without significantly affecting the layout and process (via forming process) of the substrate 120 even without particularly adding a shield member on the side of the substrate 120.

In addition, by forming the pitch P of the vias 161 and 162 to be not more than twice the width W of the vias 161 and 162 (P≤2W), it is possible to improve the effect of blocking magnetic noise on the side of the substrate 120 by the vias 161 and 162.

Via Arrangement Density

Next, an arrangement density of the vias formed on the substrate 120 will be described. The arrangement density of the vias varies depending on a position in a region sandwiched between the ground pattern 141 of the first layer 121 and the ground pattern 142 of the second layer 122. For example, a distribution of the arrangement density of the vias is a distribution according to a position of the electronic component (for example, the power supply circuit 110) disposed on the substrate 120.

In addition, the arrangement density of the vias is made such that, in a case where there are a first region in the region sandwiched between the ground pattern 141 and the ground pattern 142 and a second region closer to an end portion of the substrate 120 than the first region, the arrangement density at which the vias are formed is higher in the second region than in the first region.

In addition, the arrangement density of vias is made such that, in a case where there are a third region and a fourth region, and a path in which magnetic noise reaches the electronic element from the electronic component (for example, the power supply circuit 110) through the fourth region is shorter than a path in which the magnetic noise reaches the electronic element from the electronic component through the third region, the arrangement density at which the vias are formed is higher in the fourth region than in the third region.

Figure 10:
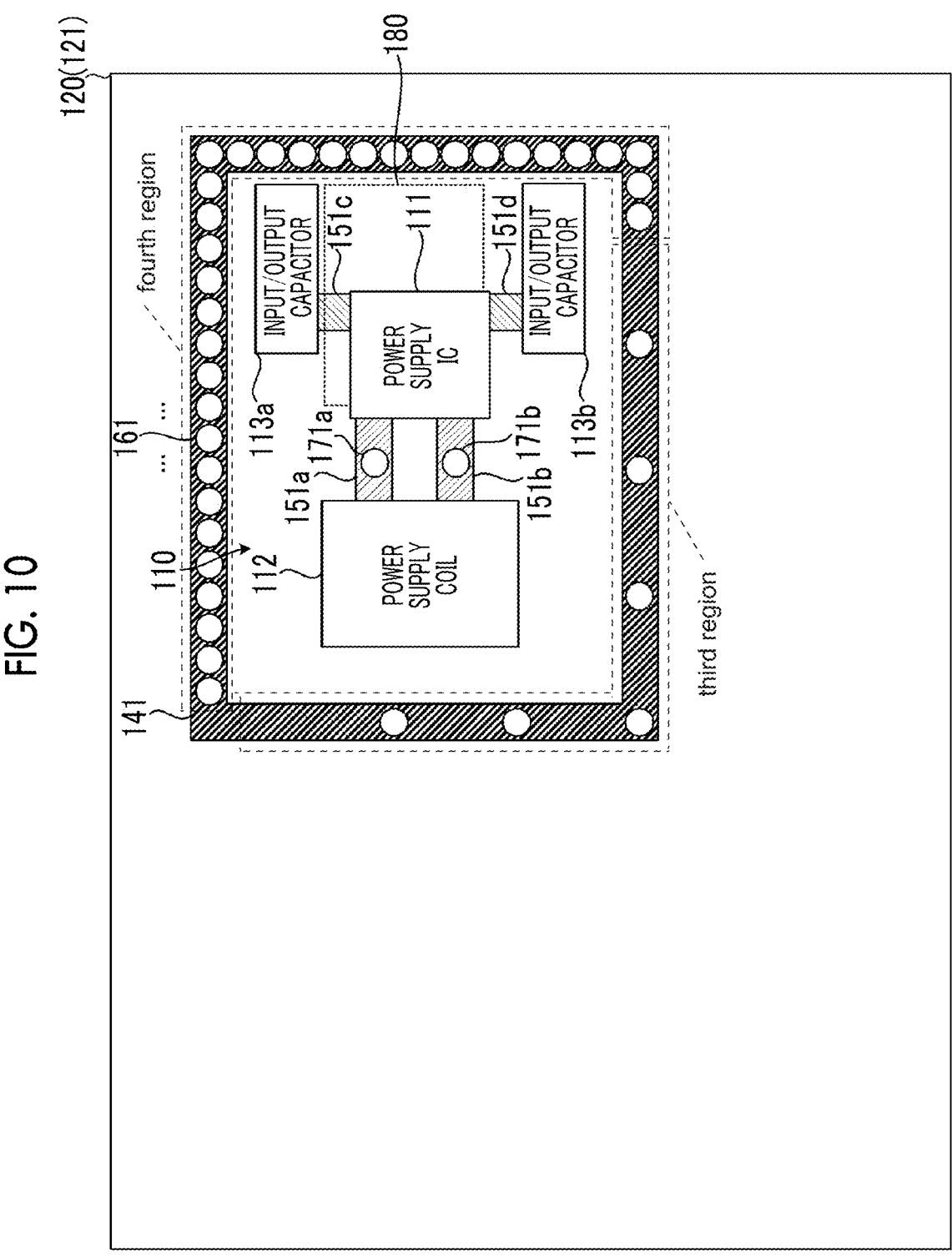
FIG. 10 is a diagram showing an example of a distribution of an arrangement density of the vias 161.

FIG. 10 is a diagram showing an example of the distribution of the arrangement density of the vias. In this example, the power supply circuit 110 is disposed close to an end portion in one direction (upper right direction in FIG. 10) on the substrate 120. In addition, an imaging element 180 (electronic element) which is susceptible to an influence of the magnetic noise generated from the power supply circuit 110 is disposed on a back side of the substrate 120 with respect to the power supply circuit 110 of the substrate 120.

In such an arrangement state of the power supply circuit 110 and the imaging element 180, the vias 161 formed between the ground pattern 141 of the first layer 121 and the ground pattern 142 of the second layer 122 are arranged such that a density of the vias 161 in a region close to the end portion of the substrate 120 (right and upper directions of the power supply circuit 110) is greater than a density of the vias 161 in a region far from the end portion of the substrate 120 (left and lower directions of the power supply circuit 110), as shown in FIG. 10. The high arrangement density of the vias 161 means that the pitch P (P≤2W) between adjacent vias 161 is small.

As a result, out of the magnetic noise leaking laterally along a surface of the substrate 120 from the power supply circuit 110, the magnetic noise that leaks to a short detour path in a substrate end portion direction (right and upper directions) as a detour path of the magnetic noise to the imaging element 180 can be effectively blocked by the vias 161.

Figure 11:
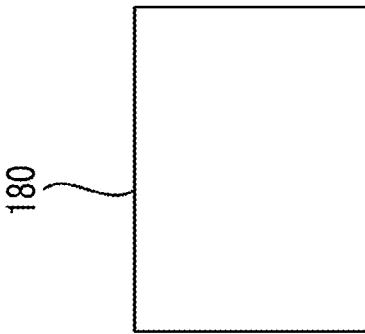
FIG. 11 is a diagram showing another example of the distribution of the arrangement density of the vias 161.

FIG. 11 is a diagram showing another example of the distribution of the arrangement density of the vias. In this example, the power supply circuit 110 is disposed at a central portion of the substrate 120. In addition, the imaging element 180 which is susceptible to the influence of the magnetic noise from the power supply circuit 110 is disposed in a lateral direction of the substrate 120 (a left direction of the power supply circuit 110).

In such an arrangement state of the power supply circuit 110 and the imaging element 180, the vias 161 formed between the ground pattern 141 of the first layer 121 and the ground pattern 142 of the second layer 122 are arranged such that a density of the vias 161 in a region close to the imaging element 180 (a left direction of the power supply circuit 110)

is greater than a density of the vias 161 in a region far from the imaging element 180 (a right direction of the power supply circuit 110), as shown in FIG. 11.

As a result, out of the magnetic noise leaking laterally along the surface of the substrate 120 from the power supply circuit 110, the magnetic noise that leaks to the imaging element 180 direction can be effectively blocked by the vias 161. Although the vias 161 have been described with reference to FIGS. 10 and 11, the vias 162 formed between the ground pattern 142 of the second layer 122 and the ground pattern 143 of the third layer 123 are also formed to have the same arrangement density as the vias 161.

Modification Example of Shield Case

Figure 12:
FIG. 12 is a diagram showing a shield case 130A of a modification example.
Figure 12:
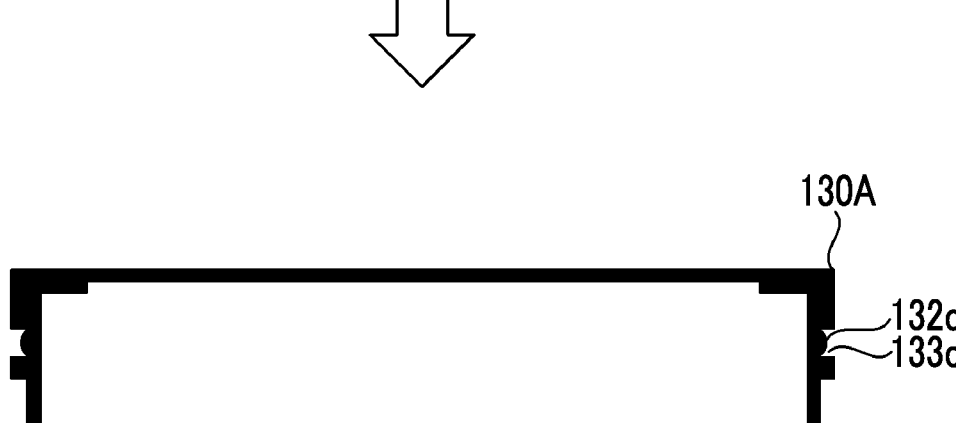

FIG. 12 is a diagram showing a modification example of the shield case 130. As shown in FIG. 12, the shield case 130A of the modification example includes a frame portion 132 and a cover portion 133. That is, while the shield case 130 described with reference to FIG. 1 is composed of one piece, the shield case 130A of the modification example is a case composed of two pieces.

The frame portion 132 includes a rectangular top wall 132a having an opening portion 132d and a side wall 132b extending downward from the top wall 132a. An engaging protrusion portion 132c that engages with the cover portion 133 is formed on the side wall 132b. The frame portion 132 is fixed to the substrate 120. A method of fixing the frame portion 132 to the substrate 120 is the same as the method of fixing the side wall 130b in the shield case 130 described with reference to FIG. 1. A lower end portion of the frame portion 132 is disposed to overlap the ground pattern 141 and is fixed to the substrate 120 by soldering to the ground pattern 141.

The cover portion 133 includes a top wall 133a that closes the opening portion 132d of the frame portion 132, and a side wall 133b that extends downward from the top wall 133a and surrounds the side wall 132b of the frame portion 132. The side wall 133b is formed with an engaging hole portion 133c at a position corresponding to a position of the engaging protrusion portion 132c formed on the side wall 132b of the frame portion 132.

The cover portion 133 is attached to the frame portion 132 by engaging the engaging hole portion 133c with the engaging protrusion portion 132c of the frame portion 132. The material, thickness, and the like of the shield case 130A are the same as those of the shield case 130. By using the shield case 130A including the frame portion 132 and the cover portion 133, a mounting position is visible through the opening portion 132d in a case of mounting the frame portion 132, so that a mounting accuracy is improved.

Figure 13:
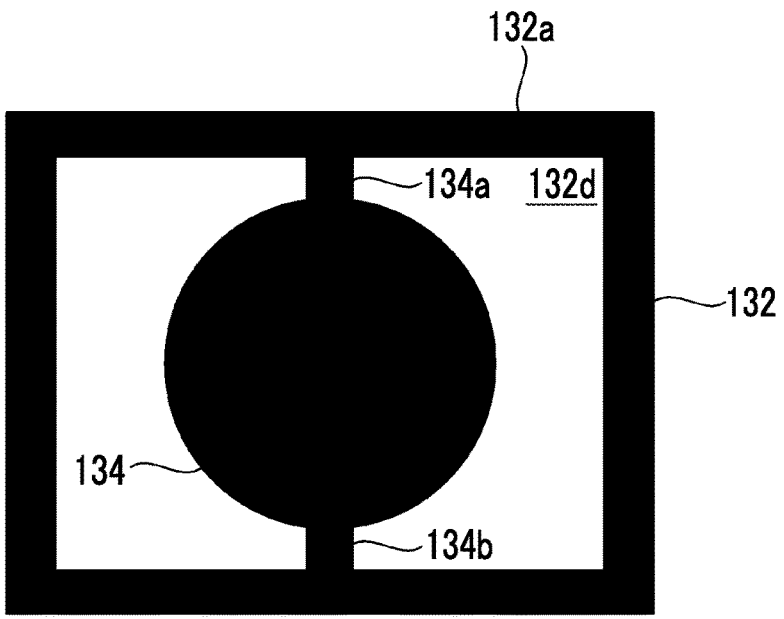
FIG. 13 is a diagram showing a suction target portion 134 provided in a frame portion 132.

FIG. 13 is a top view of the frame portion 132 in the shield case 130A. As shown in FIG. 13, the opening portion 132d of the frame portion 132 is provided with a suction target portion 134 at a substantially central portion thereof. The suction target portion 134 is, for example, a portion to be sucked by an automatic mounting machine in a case of mounting the frame portion 132 on the substrate 120. The suction target portion 134 in this example is formed in a substantially circular plate shape.

A pair of support portions 134a and 134b for supporting the suction target portion 134 to the frame portion 132 are provided on a peripheral portion of the suction target portion 134. The suction target portion 134 is supported by the frame portion 132 by connecting end portions of the support portions 134a and 134b to the top wall 132a of the frame portion 132.

The frame portion 132 can be lifted by sucking the suction target portion 134. In addition, in the frame portion 132 shown in FIG. 12, the suction target portion 134 is omitted. By providing the suction target portion 134 in the frame portion 132 in this manner, in a case where the frame portion 132 is mounted using the automatic mounting machine, the sucked frame portion 132 can be easily overlapped and disposed on the ground pattern 141.

Modification Example of Suction Target Portion

Figure 14:
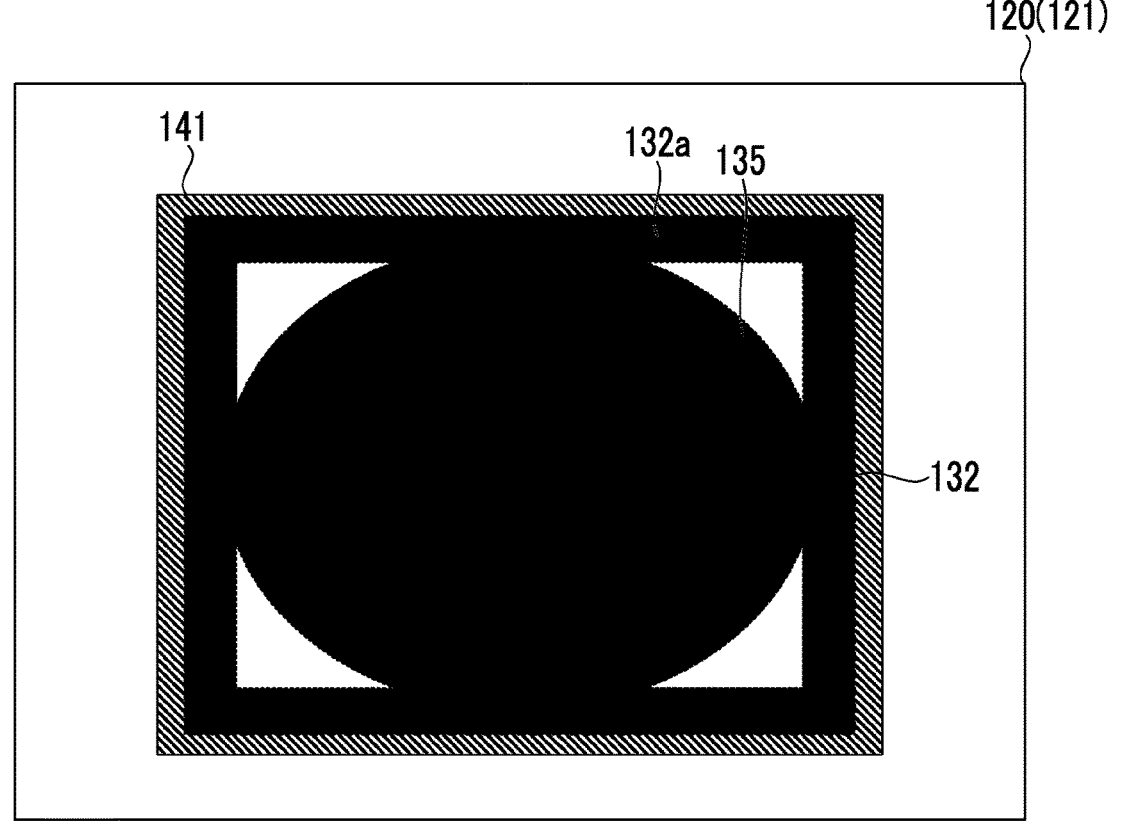
FIG. 14 is a diagram showing a suction target portion 135 of a modification example.

FIG. 14 is a diagram showing an example of a modification example of a suction target portion provided in the frame portion 132. FIG. 14 is a top view of the electronic apparatus 100 showing a state in which the cover portion 133 of the shield case 130A is removed from the frame portion 132. Further, FIG. 15 is a diagram showing a state in which the frame portion 132 (shield case 130A) of FIG. 14 is removed.

Figure 15:
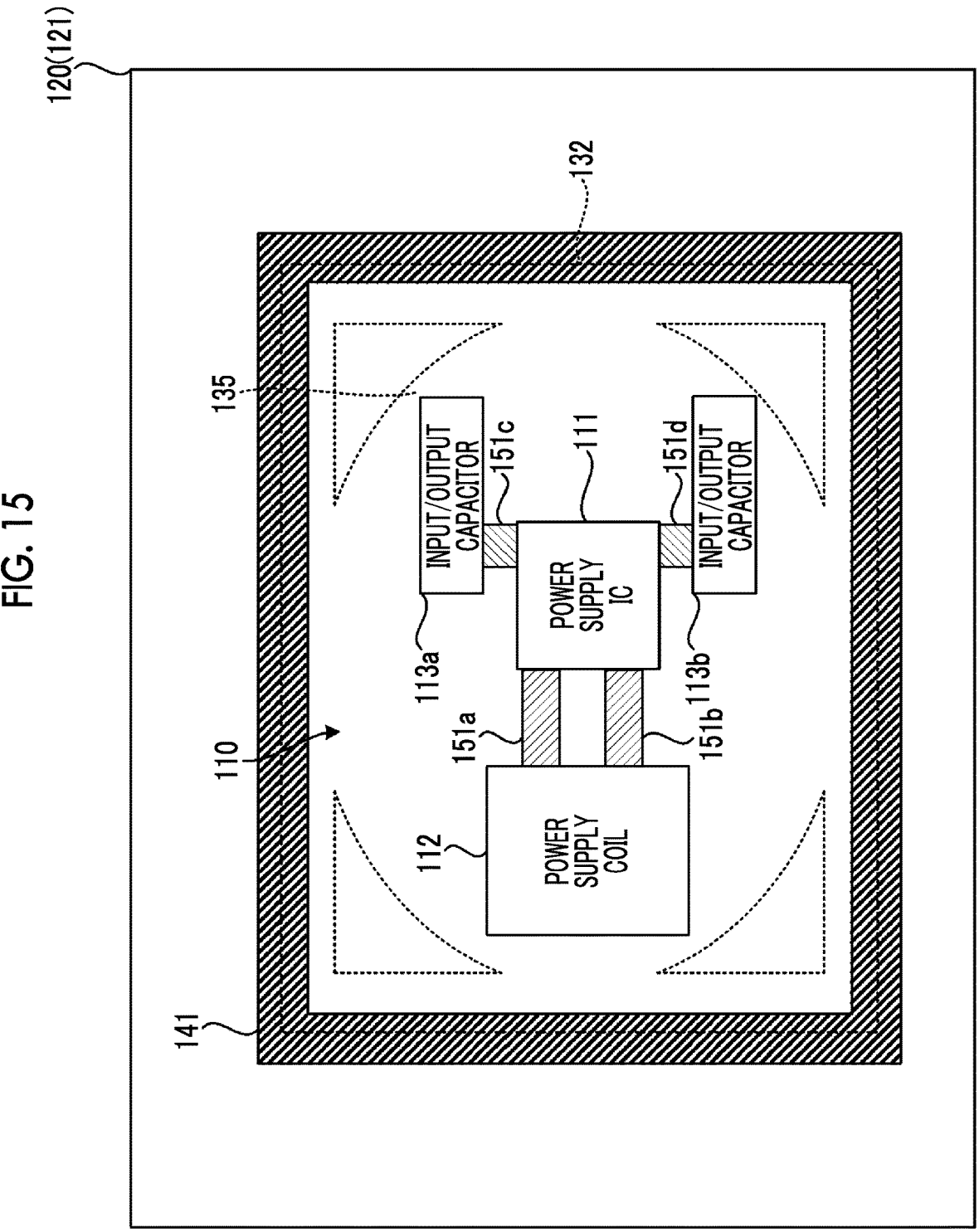
FIG. 15 is a diagram showing a state in which the frame portion 132 of FIG. 14 is removed.

As shown in FIGS. 14 and 15, a suction target portion 135 of the modification example is formed to have a size capable of covering an upper part of the power supply circuit 110 disposed on the first layer 121 of the substrate 120. It is preferable that the suction target portion 135 is provided above an input/output terminal of each electronic component constituting the power supply circuit 110. The suction target portion 135 in this example is formed in an oval plate shape and is supported by the frame portion 132 by connecting end portions in a major axis direction and a minor axis direction to the top wall 132a of the frame portion 132. As described above, since an area just above the power supply circuit 110 which is a source of the magnetic noise can be covered by the suction target portion 135, it is possible to improve a shielding effect against the magnetic noise leaking upward.

Other Examples of Width and Interval of Vias

Figure 16:
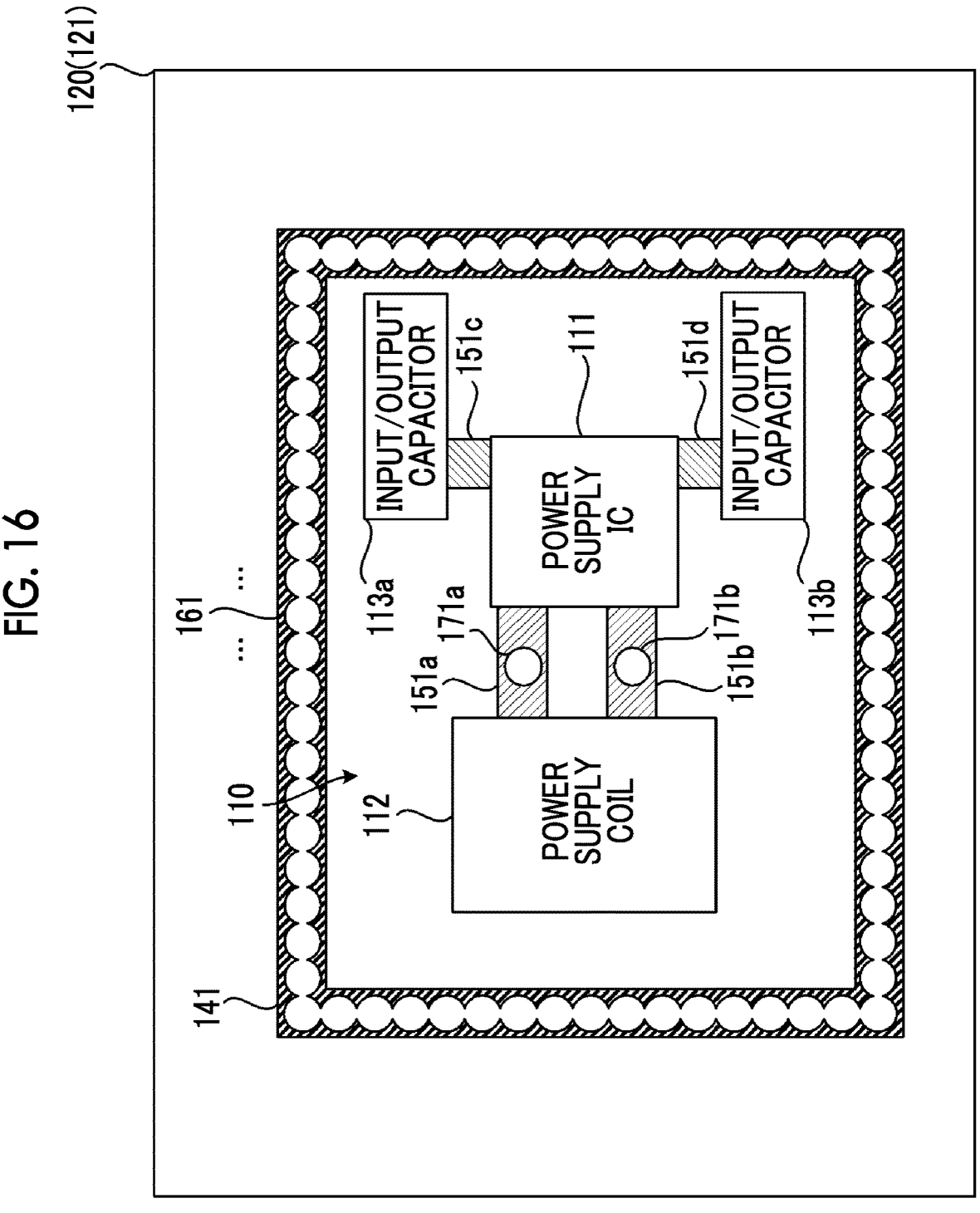
FIG. 16 is a diagram showing another example of the vias 161 formed in the first layer 121.

FIG. 16 is a diagram showing another example of the vias 161 formed on the first layer 121 of the substrate 120. As described above, the vias 161 are vias that electrically connect the ground pattern 141 of the first layer 121 and the ground pattern 142 of the second layer 122. The vias 161 of this example is formed such that the pitch P is smaller than the width W (P<W) in a relationship between the width W and the pitch P of the vias 161.

That is, adjacent vias 161 are overlapped each other and are formed in a connected state. Although the vias 161 that electrically connect the ground pattern 141 and the ground pattern 142 are described with reference to FIG. 16, the vias 162 that electrically connect the ground pattern 142 of the second layer 122 and the ground pattern 143 of the third layer 123 may be formed in the same relationship between the width W and the pitch P (P<W).

According to the vias 161 of the present configuration, since the adjacent vias 161 are overlapped each other, a thickness of the via in a portion between the adjacent vias 161 is increased. As a result, an average thickness of a wall formed by the continuously arranged vias 161 is increased, and a shielding effect by the vias 161 is further improved.

Figure 17:
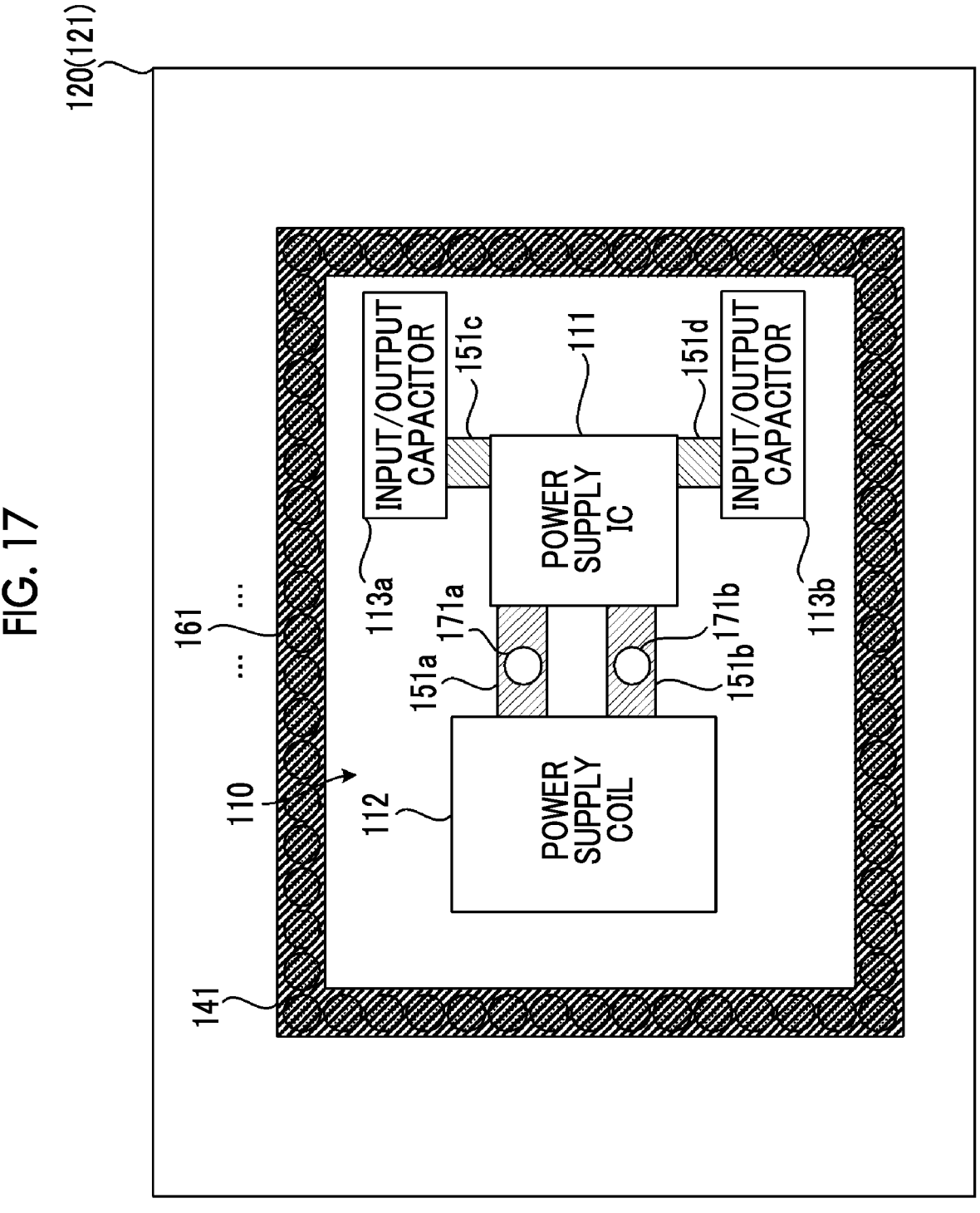
FIG. 17 is a diagram showing still another example of the vias 161 formed in the first layer 121.

FIG. 17 is a diagram showing still another example of the vias 161 formed on the first layer 121 of the substrate 120. The vias 161 of this example is vias having a configuration in which each via 161 formed in a tubular shape is filled with a conductor. For example, the via 161 of this example is a via formed in a columnar shape. The conductor in the via

161 is copper of the same material as the via 161. The material of the conductor may be, for example, brass, aluminum, or the like.

In addition, although the vias 161 that electrically connect the ground pattern 141 and the ground pattern 142 are described with reference to FIG. 17, the vias 162 that electrically connect the ground pattern 142 of the second layer 122 and the ground pattern 143 of the third layer 123 may be formed such that the vias 162 are filled with the conductor in the same manner. Further, regarding the vias 161 and 162 filled with the conductor, adjacent vias may be connected to each other in the same manner as the vias shown in FIG. 16. By adopting the vias 161 having a configuration in which the inside of the tubular shape is filled with the conductor as in this example, the shielding effect by the vias 161 can be further improved.

Figure 18:
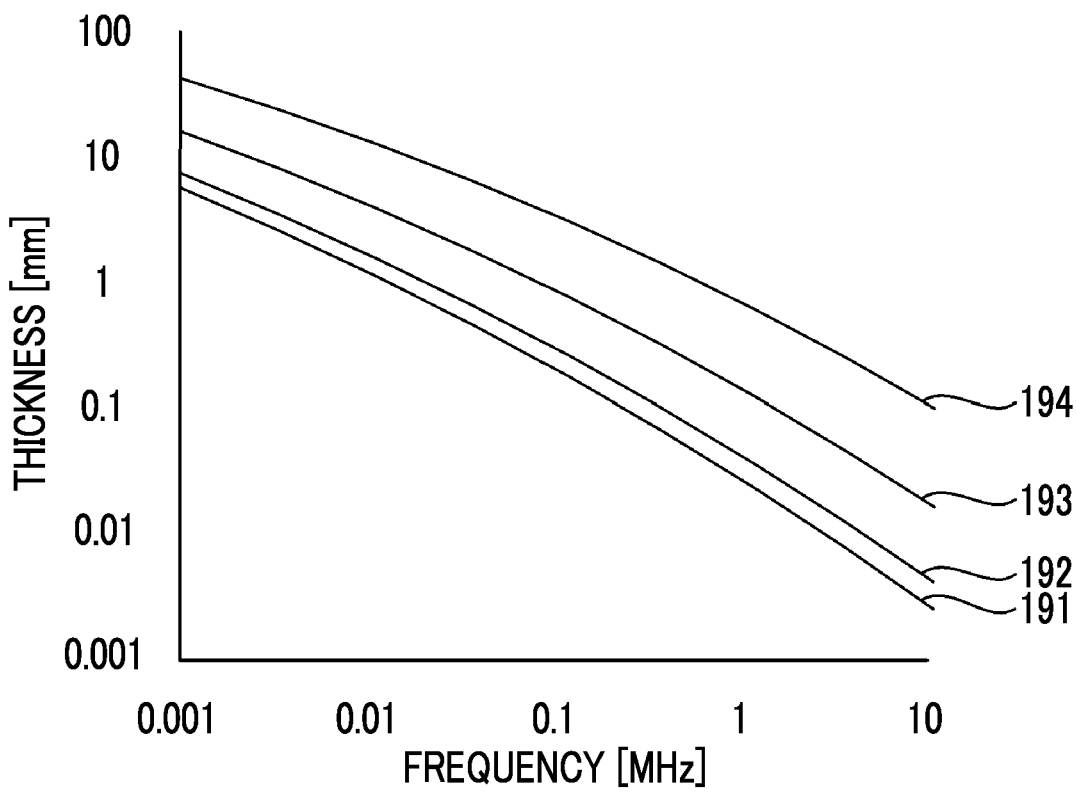
FIG. 18 is a graph showing a relationship between a thickness and a material of the shield case 130 or 130A.

FIG. 18 is a graph showing a relationship between a thickness and a material of the shield case 130 or 130A required to obtain an effect of blocking −30 dB against the magnetic noise. Examples of the material of the shield case 130 or 130A include copper 191 and aluminum 192, brass 193, and steel use stainless (SUS) 194, which have high conductivity.

A horizontal axis represents an operating frequency of the electronic component accommodated in the shield case 130 or 130A. In order to block the magnetic noise having a high frequency, the thickness of the shield case is increased or a material having high conductivity is used.

EXPLANATION OF REFERENCES

100: electronic apparatus
110: power supply circuit (electronic component)
111: power supply IC
112: power supply coil
113*a*, 113*b*: input/output capacitor
120: substrate
121: first layer
122: second layer
123: third layer
130, 130A: shield case
132: frame portion
133: cover portion
134, 135: suction target portion
141, 142, 143: ground pattern
151*a*, 151*b*, 152*a*, 152*b*: power supply line pattern
161, 162, 171*a*, 171*b*: via
180: imaging element (electronic element)
P: pitch
W: width

What is claimed is:

1. An electronic apparatus comprising:
an electronic component;
a substrate including a first layer at which the electronic component and a first ground pattern are disposed, and a second layer at which a second ground pattern is disposed; and
a case which is in contact with the first ground pattern, covers the electronic component, reduces magnetic noise, and is fixed to the substrate, wherein the case comprises a side wall which extends toward the first layer and is in contact with the first ground pattern,
wherein the case is disposed such that a lower end portion of the side wall overlaps the first ground pattern as viewed from a lamination direction of the substrate,
wherein a plurality of conductors connecting the first ground pattern and the second ground pattern are disposed along a portion of the first ground pattern, the portion being in contact with the case, and the plurality of conductors are disposed at positions corresponding to the lower end portion of the side wall of the case that overlaps the first ground pattern as viewed from the lamination direction of the substrate,
wherein an arrangement density of the plurality of conductors varies depending on a position in a region sandwiched between the first ground pattern and the second ground pattern,
wherein a distribution of the arrangement density of the plurality of conductors is a distribution according to a positional relationship between the electronic component and an electronic element disposed outside the case,
wherein the region sandwiched between the first ground pattern and the second ground pattern includes a first region and a second region,
a path in which the magnetic noise reaches the electronic element from the electronic component through the second region is shorter than a path in which the magnetic noise reaches the electronic element from the electronic component through the first region, and
the arrangement density of the plurality of conductors is higher in the second region than in the first region.

2. The electronic apparatus according to claim 1,
wherein the electronic component includes at least one of a power supply circuit, a coil, or a capacitor.

3. The electronic apparatus according to claim 2,
wherein the substrate is a substrate having three or more layers including the first layer and the second layer.

4. The electronic apparatus according to claim 1
wherein an area of the second ground pattern as viewed in the lamination direction of the substrate, in which the first layer and the second layer are laminated, is larger than an area of a region of the substrate at which the electronic component is disposed.

5. The electronic apparatus according to claim 4,
wherein the second ground pattern is formed in a region including the region at which the electronic component is disposed as viewed in the lamination direction of the substrate.

6. The electronic apparatus according to claim 5,
wherein the substrate is a substrate having three or more layers including the first layer and the second layer.

7. The electronic apparatus according to claim 4,
wherein the substrate is a substrate having three or more layers including the first layer and the second layer.

8. The electronic apparatus according to claim 1,
wherein the case includes a frame portion fixed to the substrate and a cover portion attached to the frame portion, and
the frame portion has a suction target portion capable of being sucked so that the frame portion is lifted.

9. The electronic apparatus according to claim 1,
wherein the first ground pattern is disposed to surround the electronic component as viewed in the lamination direction of the substrate in which the first layer and the second layer are laminated.

10. The electronic apparatus according to claim 9,
wherein the plurality of conductors are arranged to surround the electronic component as viewed in the lamination direction of the substrate.

11. The electronic apparatus according to claim 1,
wherein the region sandwiched between the first ground pattern and the second ground pattern includes a third region and a fourth region that is closer to an end portion of the substrate than the third region, and the arrangement density of the plurality of conductors is higher in the fourth region than in the third region.

12. The electronic apparatus according to claim 1, wherein the plurality of conductors are a plurality of vias connecting layers of the substrate.

13. The electronic apparatus according to claim 12, wherein the vias are vias whose holes are filled with conductors that reduce the magnetic noise.

14. The electronic apparatus according to claim 12, wherein the plurality of vias are a plurality of connected vias.

15. The electronic apparatus according to claim 1, wherein the plurality of conductors are arranged at a pitch of not more than twice a width of each of the conductors.

16. The electronic apparatus according to claim 1, wherein the substrate is a substrate having three or more layers including the first layer and the second layer.

\* \* \* \* \*